(12) United States Patent
Gopalakrishnan et al.

(10) Patent No.: US 7,928,419 B2
(45) Date of Patent: Apr. 19, 2011

(54) ELECTROLYTIC DEVICE BASED ON A SOLUTION-PROCESSED ELECTROLYTE

(75) Inventors: Kailash Gopalakrishnan, San Jose, CA (US); David B. Mitzi, Mahopac, NY (US); Rohit S. Shenoy, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 867 days.

(21) Appl. No.: 11/830,213

(22) Filed: Jul. 30, 2007

(65) Prior Publication Data

US 2008/0314739 A1    Dec. 25, 2008

Related U.S. Application Data

(63) Continuation of application No. 11/765,142, filed on Jun. 19, 2007.

(51) Int. Cl.
| | |
|---|---|
| *H01L 47/00* | (2006.01) |
| *B01D 59/50* | (2006.01) |
| *C25C 3/00* | (2006.01) |
| *C25C 5/04* | (2006.01) |
| *C25C 7/00* | (2006.01) |
| *G11C 11/00* | (2006.01) |
| *B05D 5/12* | (2006.01) |

(52) U.S. Cl. .................. 257/2; 257/E45.002; 204/247.4; 365/148; 427/123

(58) Field of Classification Search ....... 257/2, E45.002; 204/247.4; 365/148; 427/123
See application file for complete search history.

(56) References Cited

U.S. PATENT DOCUMENTS

| | | | |
|---|---|---|---|
| 6,858,482 B2 * | 2/2005 | Gilton | 438/199 |
| 2005/0158909 A1 | 7/2005 | Milliron et al. | |
| 2006/0109708 A1 | 5/2006 | Pinnow et al. | |

FOREIGN PATENT DOCUMENTS

| | | |
|---|---|---|
| CN | 1595677 A | 3/2005 |
| CN | 1650419 A | 8/2005 |
| EP | 1501124 | 1/2005 |
| JP | 2002-536840 T | 10/2002 |
| JP | 2005051224 A | 2/2005 |
| JP | 2006-040946 A | 2/2006 |
| JP | 2006060235 A | 3/2006 |
| JP | 2007-019449 A | 1/2007 |

(Continued)

OTHER PUBLICATIONS

Milliron et al., "Solution-phase deposition and nanopatterning of GeSbSe phase-change materials", Nature Materials, vol. 6, No. 5, 2007, pp. 352-356.

(Continued)

*Primary Examiner* — David S Blum
(74) *Attorney, Agent, or Firm* — Connolly Bove Lodge & Hutz LLP; Daniel E. Johnson (57) ABSTRACT

The present disclosure relates to a solid electrolyte device comprising an amorphous chalcogenide solid active electrolytic layer; first and second metallic layers. The amorphous chalcogenide solid active electrolytic layer is located between the first and second metallic layers. The amorphous chalcogenide solid active electrolytic layer is prepared by obtaining a solution of a hydrazine-based precursor to a metal chalcogenide; applying the solution onto a substrate; and thereafter annealing the precursor to convert the precursor to the amorphous metal chalcogenide. The present disclosure also relates to processes for fabricating the solid electrolyte device.

17 Claims, 9 Drawing Sheets

FOREIGN PATENT DOCUMENTS

| | | |
|---|---|---|
| JP | 2007-185764 A | 7/2007 |
| WO | WO-2005112118 A1 | 11/2005 |
| WO | WO-2007029938 A1 | 3/2007 |

OTHER PUBLICATIONS

David B. Mitzi et al., "High-Mobility p-Type Transistor Based on a Spin-Coated Metal Telluride Semiconductor", Adv. Mater. 2006, 18, 2448-2452.

David B. Mitzi et al., "Low-Voltage Transistor Employing a High-Mobility Spin-Coated Chalcogenide Semiconductor", Adv. Mater. 2005, 17, 1285-1289.

David B. Mitzi et al., High-mobility Ultrathin Semiconducting Films Prepared by Spin Coating, Nature, vol. 428, Mar. 18, 2004, 299-303.

K. Terabe et al., Formation and Disappearance of a Nanoscale Silver Cluster Realized by Solid Electrochemical Reaction:, J. of Appl. Phys., vol. 91, No. 12, Jun. 15, 2002, 10110-10114.

Michael N. Kozicki et al., "Nanoscale Memory Elements Based on Solid-State Electrolytes", IEEE Transactions on Nonotechnology, vol. 4, No. 3, May 2005, 331-338.

U.S. Appl. No. 11/556,385, filed Nov. 3, 2006, Gopalakrishnan.

U.S. Appl. No. 11/679,785, filed Feb. 18, 2007, Soundararajan.

* cited by examiner

ELECTROLYTIC DEVICE BASED ON A SOLUTION-PROCESSED ELECTROLYTE

CROSS-REFERENCE TO RELATED APPLICATIONS

This application is a continuation of our copending U.S. application Ser. No. 11/765,142, filed on Jun. 19, 2007 and entitled "Electrolytic Device and Method of Making Using a Solution-Processed Electrolyte", entire disclosure of which is incorporated herein by reference.

BACKGROUND OF INVENTION

1. Technical Field

The present disclosure relates to an improved electrolytic device. In particular, according to the present disclosure, a high-quality amorphous metal or metalloid chalcogenide film obtained by a relatively high throughput/low-temperature solution-deposition method is used as the active electrolytic layer in the solid-state electrolytic device. The present disclosure also relates to a process for fabricating the solid-state electrolytic device

2. Background Art

In solid-state electrolyte devices, the solid-state electrolyte material generally consists of a Ag-, Cu-, Zn- or Li-doped amorphous chalcogenide (most typically, $GeS_2$, $GeSe_2$, $As_2S_3$, $As_2Se_3$), which acts like an excellent conductor of ions (i.e., $Ag^+$, $Cu^+$, $Zn^{2+}$, $Li^+$, etc). The amorphous chalcogenide may be of a binary composition (i.e., $GeS_{2-x}$, $GeSe_{2-x}$, $As_2S_3$, $As_2Se_3$) or may contain three or more elements (i.e., $Ge_{1-x}Sn_xS_{2-y}Se_y$, $GeSb_xS_y$, $AS_{2-x}Sb_xS_{3-y}Se_y$, $GeSe_{2-y}Te_y$, etc.). Doping of the amorphous chalcogenide is obtained by either co-deposition or by electrical/thermal or UV diffusion of the metal or metalloid into the pre-deposited amorphous chalcogenide. UV diffusion is normally the preferred technique and results in a system that has a saturated and uniform concentration of the dopant in the material (which depends on the stoichiometry of the starting material). Both the undoped and doped chalcogenides have very high resistance (typically >1 gigaohms for a 30×30×30 nm region).

If such a doped amorphous chalcogenide material is sandwiched between two metals, one of which is reactive (i.e., containing the dopant Ag, Cu, Zn, Li; henceforth referred to as the anode) and the other one of which is an inert material (e.g., W, TiN, TaN, Al, Ni, etc.; henceforth referred to as the cathode), then the following electrical effects are achieved:

(a) On the application of a small positive bias (bias being applied to the anode), it is believed that ions diffuse from the anode and the solid electrolyte material towards the cathode and form a conducting "metallic" filament that starts at the cathode and builds up towards the anode. This happens as long as the applied bias is greater than the "threshold" voltage for formation (which depends on the material and the bottom electrode and is generally between 0 and 1.0 V). When the filament is fully formed, it will result in a short between the 2 electrodes. This results in a very low resistance state (typically <1 Mohm). This conducting filament stays for a period even after the applied bias has been removed. The formed filament, though nominally permanent, tends to diffuse back into the electrolyte (with no applied bias), causing the on-state resistivity to increase over time (faster at elevated temperature). Typically the ON resistance is a function of the steady-state current during programming: $R_{on}=V_{th}/I_{on}$, where $V_{th}$ is the electrodeposition threshold (typically lower than the threshold voltage for formation). Typical programming times are of the order of 50-100 ns or faster, but may be much slower depending on various factors including the method of deposition of the amorphous chalcogenide.

(b) When a negative bias is applied to the anode (and a conducting filament already exists), then ions move out of the conducting filament back into the solid electrolyte and eventually into the anode. A break in the metallic filament can result in high resistance.

Typically for times <100 ns, the entire metallic filament is erased and an ultra-high resistance is obtained.

Figure 1:
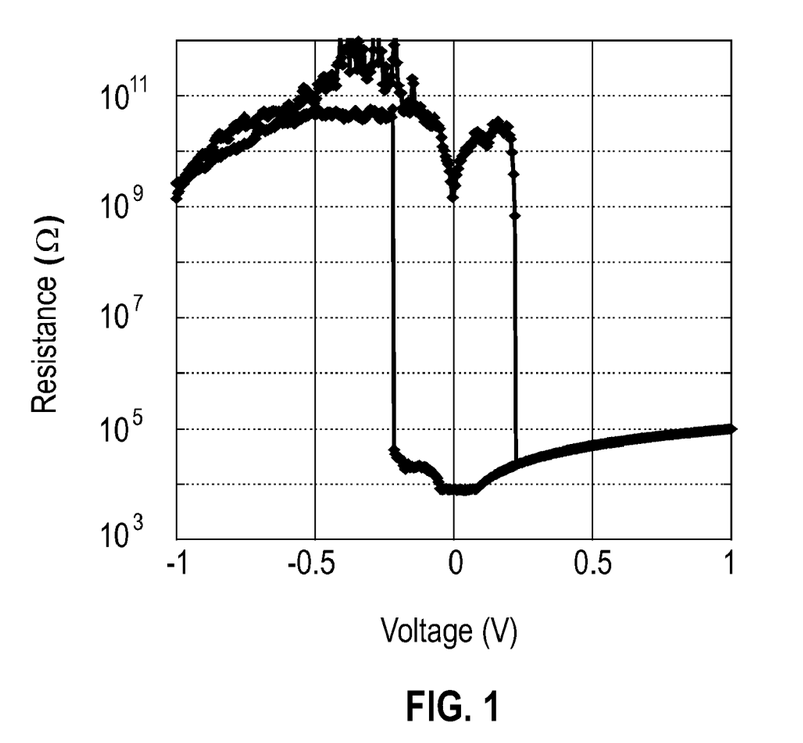
FIG. 1 illustrates electrolytic device characteristics for an Ag—Ge—S device.

These device characteristics are illustrated in FIG. 1. FIG. 1 illustrates electrolytic device characteristics for an Ag—Ge—S device. At a slight positive voltage ($V_a$=0.2 V), the device switches to the low resistance state. At $V_b$=−0.2V, the device switches to the high resistance state. $V_a$ (turn-on voltage) and $V_b$ (turn-off voltage) range from 0 to +/−1V and depend on the material and the cathode. The ON resistance of the solid electrolyte memory is a function of the program current (i.e., $R_{on}=V_{th}/I_{on}$). The OFF resistance is a function of the resistivity of the solid electrolyte and of the double layer at the interface. The device turns on by forming a thin metallic bridge between the inert and oxidizable electrode. $V_{th}$ is the electrodeposition threshold and $I_{on}$ is the on-current that is used for programming (see Kozicki et al, Programmable Metallization Cell Memory based on Ag—Ge—S and Cu—Ge—S, NVMTS 2005, pp. 83-9).

The following are some potential applications for a solid electrolyte material:

(a) Use as a memory material—where the low and high resistance states can be labeled as 1 and 0 respectively (see Kozicki et al., *IEEE Trans. Nanotech.* 4, 331(2005) and Terabe et al, *J. Appl. Phys.* 91, 10110(2002).

(b) As a diode material-especially for high current density memory elements.

Typically, the amorphous chalcogenide material (either doped or pre-doped) is deposited using a vacuum-based technique such as sputtering or thermal evaporation. Such techniques are relatively costly and time-consuming, since they rely on achieving a high-vacuum environment in a confined space prior to the deposition. In addition, compositional control may be difficult to achieve due to effects such as preferential sputtering in composite targets, the need to balance evaporation rates for multiple evaporation sources and the added difficulty of vacuum-depositing sulfur compounds because of the high vapor pressure of sulfur. Finally, deposition on complex surfaces (i.e., those containing vias and trenches) can be problematic for directional sputtering techniques.

Therefore, it would be highly desirable to develop alternative methods for depositing the amorphous chalcogenide active layer for an electrolytic device.

SUMMARY OF DISCLOSURE

The present disclosure addresses concerns of the prior art. In particular, according to the present disclosure, a high-quality amorphous chalcogenide film obtained by a solution-deposition method is used as the active electrolytic layer in a solid-state electrolytic device.

In particular, the solid electrolyte device of the present disclosure comprises an amorphous chalcogenide solid active electrolytic layer; a first metallic layer; and a second metallic layer. The amorphous chalcogenide solid active electrolytic layer is located between the first and second metallic layers.

The amorphous chalcogenide solid active electrolytic layer is prepared by providing a solution such as a hydrazine-based solution of a precursor to a metal chalcogenide or metalloid-based chalcogenide; applying the solution onto a substrate; and thereafter annealing the precursor to convert the precursor to the amorphous metal chalcogenide or amorphous metalloid-based chalcogenide. For the purpose of this disclosure, the term "metal chalcogenide" is used in its most general sense, so that it encompasses metals as well as metalloids (e.g., Ge) within the metal position.

The present disclosure also relates to a process for fabricating the solid electrolyte device. The process comprises: providing a solution, such as a hydrazine-based solution, of a precursor to a metal or metalloid chalcogenide; applying the solution onto a substrate; thereafter annealing the precursor to convert the precursor to an amorphous metal or metalloid chalcogenide layer; forming a first metallic layer and forming a second metallic layer; wherein the amorphous metal or metalloid chalcogenide is between the first and second metallic layers.

Still other objects and advantages of the present disclosure will become readily apparent by those skilled in the art from the following detailed description, wherein it is shown and described only in the preferred embodiments, simply by way of illustration of the best mode. As will be realized, the disclosure is capable of other and different embodiments, and its several details are capable of modifications in various obvious respects, without departing from the spirit of the disclosure. Accordingly, the description is to be regarded as illustrative in nature and not as restricted.

SUMMARY OF DRAWINGS

FIG. 10, which includes

FIGS. 12 A and B show device characteristics for two electrolytic memory cells (inverted mushroom-type).

BEST AND VARIOUS MODES FOR CARRYING OUT DISCLOSURE

The present disclosure is concerned with an improved electrolytic memory device employing as the active layer in the solid-state electrolytic device a solution-deposited high-quality amorphous metal or metalloid chalcogenide film. For the purpose of this disclosure, as mentioned above, the term "metal chalcogenide" is used in it's most general sense, so that it encompasses metals as well as metalloids (e.g., Ge) within the metal position.

The solution-deposition is accomplished employing a hydrazine-based solvent as will be discussed below. Important to the present disclosure is depositing amorphous films as contrasted to crystalline films. Amorphous films are required for the successful fabrication of an electrolytic device as described above.

The solution-based deposition process involves 3 steps:
1) Preparation of the hydrazine-based precursor solution.
2) Applying or depositing the solution onto a substrate.
3) Annealing the precursor to convert the precursor to the amorphous chalcogenide film.

A solution of the metal chalcogenide material can be prepared using one of the techniques disclosed in U.S. Pat. Nos. 6,875,661 and 7,094,651; and U.S. patent application Ser. No. 11/0955,976 and Ser. No. 11/432,484, US Patent Publication 2005-0009225 and US Patent Application Publication 2005-0158909.

Typically, the process involves dissolving a metal or metalloid chalcogenide in a solvent such as hydrazine (or a hydrazine-like solvent) at near ambient temperatures, with optionally extra chalcogen added to improve solubility. Typical hydrazine compounds are represented by the formula:

wherein each of $R^1$, $R^2$, $R^3$ and $R^4$ is independently hydrogen, aryl such as phenyl, a linear or branched alkyl having 1-6 carbon atoms such as methyl, ethyl or a cyclic alkyl of 3-6 carbon atoms. The most typical solvent is hydrazine. The present disclosure is not limited to the use of hydrazine, but it can also be used with other solvents including, but not limited to, hydrazine-like solvents, as disclosed above, such as 1,1-dimethylhydrazine and methylhydrazine or mixtures of hydrazine-like solvents with other solvents including, but not limited to, water, methanol, ethanol, acetonitrile and N,N-dimethylformamide. However, with certain highly-reactive metals, e.g., sodium and potassium and other alkali metals, it is preferred that the solvent be anhydrous.

The solution may also be prepared by directly dissolving the corresponding metal or metalloid of the chalcogenide in hydrazine, with at least enough chalcogen added to effect the formation and dissolution of the metal chalcogenide in solution as described in U.S. patent application Ser. No. 11/432,484. Alternatively, the solution may be formed by dissolving a preformed hydrazinium-based precursor in a non-hydrazine-based solvent, such as a mixture of ethanolamine and dimethyl sulfoxide (DMSO), as described in U.S. Pat. No. 7,094,651. Examples of other solvents are n-butylamine, n-propylamine, diethanolamine, alcohols, water, dimethyl formamide (DMF) and mixtures thereof. Also see Mitzi et al., *Adv. Mater.* 17, 1285 (2005) for other solvents.

In another method of preparing the solution, a chalcogenide and an amine are first contacted to produce an ammonium-based precursor of the metal chalcogenide, which is then contacted with a hydrazine compound and optionally, an elemental chalcogen. This method includes the steps of:

contacting at least one metal chalcogenide and a salt of an amine compound with $H_2S$, $H_2Se$ or $H_2Te$, wherein the amine compound is represented by the formula:

wherein each of $R^5$, $R^6$, and $R^7$ is independently hydrogen, aryl such as phenyl, a linear or branched alkyl having 1-6 carbon atoms such as methyl, ethyl or a cyclic alkyl of 3-6 carbon atoms, to produce an ammonium-based precursor of the metal chalcogenide;

contacting the ammonium-based precursor of the metal chalcogenide with a hydrazine compound represented by the formula:

wherein each of $R^1$, $R^2$, $R^3$ and $R^4$ is independently hydrogen, aryl such as phenyl, a linear or branched alkyl having 1-6 carbon atoms such as methyl, ethyl or a cyclic alkyl of 3-6 carbon atoms, and optionally, an elemental chalcogen, such as S, Se, Te or a combination thereof, to produce a solution of a hydrazinium-based precursor of the metal or metalloid chalcogenide in the hydrazine compound.

Typically, the amine compound is $NH_3$, $CH_3NH_2$, $CH_3CH_2NH_2$, $CH_3CH_2CH_2NH_2$, $(CH_3)_2CHNH_2$, $CH_3CH_2CH_2CH_2NH_2$, phenethylamine, 2-fluorophenethylamine, 2-chlorophenethylamine, 2-bromophenethylamine, 3-fluorophenethylamine, 3-chlorophenethylamine, 3-bromophenethylamine, 4-bromophenethylamine, 2,3,4,5,6-pentafluorophenethylamine or a combination thereof.

Examples of suitable metals for the metal chalcogenide are the transition and non-transition metals and metalloids including tin, germanium, lead, indium, antimony, mercury, gallium, thallium, potassium, copper, iron, cobalt, nickel, manganese, tungsten, molybdenum, zirconium, hafnium, titanium, and niobium or a combination thereof. The chalcogen is typically S, Se, Te or a combination thereof.

The concentration of the metal chalcogenide precursor in the hydrazine compound is typically no more than about 10 molar and more typically about 0.01 molar to about 10 molar, even more typically about 0.05 to about 5 molar, or about 0.05 to about 1 molar.

In one embodiment, the metal chalcogenide can be represented by the formula MX, $MX_2$ or $M_2X_3$, wherein M is a main group or non-transition metal or metalloid, such as potassium, germanium, tin, lead, antimony, bismuth, gallium, and indium, or a transition metal such as copper, iron, cobalt, nickel, manganese, tungsten, molybdenum, zirconium, hafnium, titanium, and niobium or a combination thereof and wherein X is a chalcogen, such as, S, Se, Te or a combination thereof.

In another embodiment, the metal chalcogenide can be represented by the formula MX or $M_2X_3$, wherein M is lanthanum or a lanthanide-metal, such as lanthanum, yttrium, gadolinium and neodymium or a combination thereof, and wherein X is a chalcogen, such as, S, Se Te or a combination thereof.

In yet another embodiment, the metal chalcogenide can be represented by the formula $M_2X$, wherein M is a metal such as Cu or K, and wherein X is a chalcogen, such, as S, Se, Te or a combination thereof.

The hydrazine-based precursor may either be an ionic solid comprised of metal or metalloid chalcogenide anions and hydrazinium cations or a more covalent compound comprised of an extended metal chalcogenide framework with covalently-bonded hydrazine molecules. Examples of ionic precursors include $(N_2H_5)_4Sn_2S_6$, $(N_2H_4)_3(N_2H_5)_4Sn_2Se_6$ and $(N_2H_5)_4Ge_2Se_6$, each of which consists of dimers of edge-sharing $MX_4^{4-}$ (M=Sn or Ge; X=S or Se) tetrahedra, separated by hydrazinium cations. An example of a covalent precursor is $(N_2H_4)_2ZnTe$.

The metal or metalloid chalcogenide precursor films are deposited on a substrate using the solutions prepared as disclosed above. Suitable substrates for film deposition include: silicon, quartz, glass, sapphire, metal, gallium nitride, gallium arsenide, germanium, silicon-germanium, indium-tin-oxide, alumina ($Al_2O_3$), and plastic (e.g., Kapton, polycarbonate). The substrate may be rigid or flexible. Using high-throughput techniques such as spin-coating, stamping, dip coating, doctor blading, drop casting, or printing, solutions are applied to the substrate and transformed into thin films of the precursor upon evaporation of the solvent. Some of the solution processing techniques (e.g., printing, stamping) enable simultaneous film deposition and patterning. The key point in this step is to have chosen a solvent that will wet the appropriately prepared substrate (i.e., an oxidized silicon surface can be prepared to be either hydrophilic or hydrophobic to promote solution wetting, depending upon the nature of the solvent used), thereby facilitating the formation of a uniform film upon drying.

The substrate desirably is typically free of contaminants, and may be prepared for solution deposition by cleaning and/or surface pretreatment. Cleaning can be accomplished by sonication in a variety of solvents, such as ethanol, methanol or acetone and/or by heating in various cleaning solutions, such as sulfuric acid/hydrogen peroxide (Piranha) or ammonium hydroxide solutions. The cleaning can also be carried out using UV-ozone or oxygen plasma treatment.

A low-temperature thermal treatment is used to decompose the resulting metal chalcogenide precursor film on the substrate, resulting in the formation of a metal chalcogenide amorphous film. The substrate coated with the precursor film can be heated by placing it on a hot plate, or in a box or tube furnace under an appropriate inert atmosphere such as nitrogen, forming gas or argon. Alternatively, the heating may take place by laser-based or microwave-based annealing for much more rapid processing. Heating is performed at a temperature high enough and for a time long enough to enable complete decomposition of the hydrazine-based precursor into the targeted metal chalcogenide, but low enough and for a short enough time that substantial crystallization does not occur. Preferably the heating is carried out at a temperature of about 100 to about 400° C. and more typically about 100 to about 350° C. and for an amount of time from about 0.2 to about 60 minutes. Additionally, the choice of the metal chalcogenide may be used to promote the formation of amorphous films. The particular temperatures used to obtain an amorphous film depends upon the chalcogenide precursor, which can be determined by those skilled in the art without undue experimentation in view of this disclosure. For instance, metal or metalloid chalcogenides based on the lighter metals or metalloids have less of a tendency to crystallize and therefore temperatures at the higher end of the range can be used while still maintaining an amorphous film.

Solution-based techniques are particularly attractive because of the array of available options for high-throughput film deposition, including spin coating, dip coating, doctor blading, ink-jet printing, stamping, etc. These techniques have the advantage of being potentially low-cost, high-throughput techniques and are readily compatible with roll-to-roll processing. Prior to this disclosure, the active layer was typically deposited using a slower and more costly vacuum-based technique such as sputtering or evaporation.

Advantages of this process are that it allows for potentially low-cost, very high-throughput deposition of amorphous metal chalcogenide films for use in electrolytic devices, without the requirement of vacuum conditions or specialized CVD reactors. The solution-processing technique is also a relatively low-temperature process and is compatible with selected higher-temperature flexible plastic substrate materials, such as Kapton and other polyimide-based plastics. Additionally, solution-processing provides a natural mechanism for filling vias and trenches on a substrate, which can be difficult to achieve using more directional deposition techniques such as sputtering (see U.S. patent application Ser. No. 11/556,385, entitled Method for Filling Holes with Metal Chalcogenides, filed Nov. 3, 2006, the disclosure of which is incorporated herein by reference). Finally, the solution processing mechanism provides a convenient means of doping the amorphous metal chalcogenide layer, since the corresponding dopant metal can be dissolved in the solution with the targeted metal chalcogenide prior to solution processing (i.e., without the need for UV diffusion).

Figure 2:
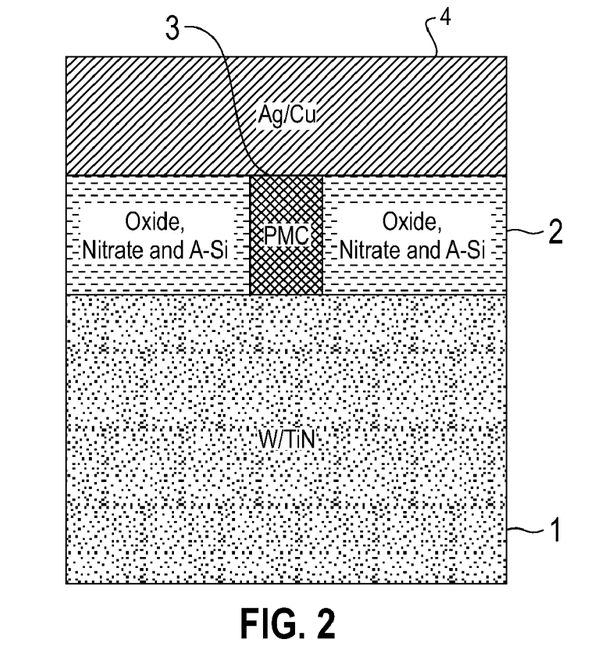
FIG. 2 is a schematic diagram of a pillar cell employing the solid electrolyte (PMC or programmable metallization cell) of this disclosure.
Figure 3:
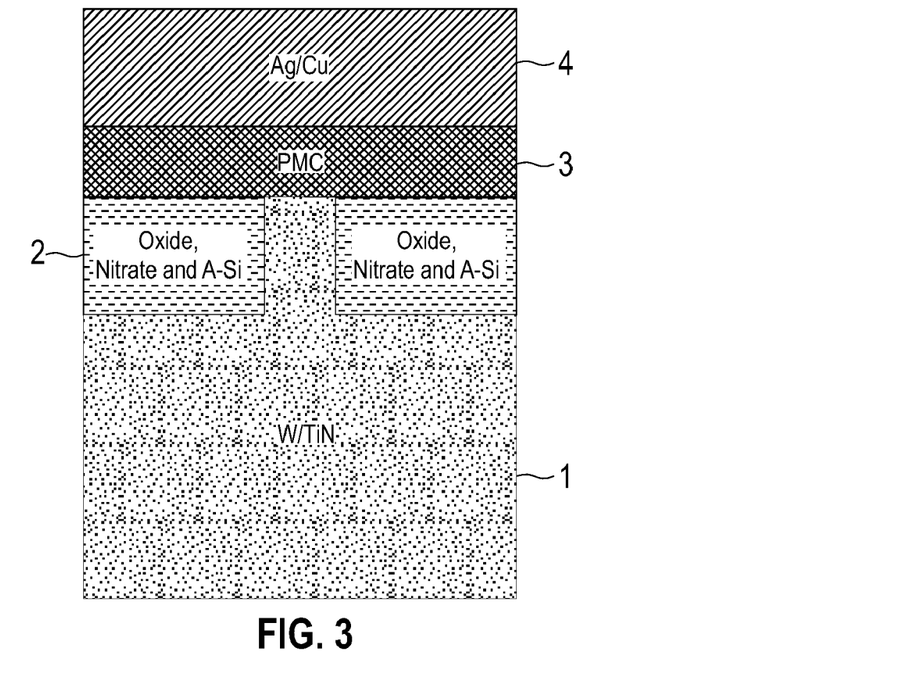
FIG. 3 is a schematic diagram of a mushroom cell employing the solid electrolyte (PMC) of this disclosure.

Examples of representative electrolytic device structures in which the solution-processed solid electrolyte (SE) layers (deposited as described above) can be employed are schematically shown in FIGS. 2-5. For instance, FIG. 2 illustrates a pillar cell. This structure can be fabricated using many sequences, one of which is described below:

(a) Bottom electrode is deposited and patterned-either directly or via a damascene process. The bottom electrode 1 is shown as W or TiN, but could alternatively be Cu or Ag or some other metal with a TiN/TaN barrier layer.
(b) The second step is ILD 2 (inter-level dielectric) deposition and via formation, with a stop on the bottom metal.
(c) Next the solid electrolyte is spin coated onto the substrate (either co-doped during spin coating or UV doped to saturation after deposition). The PMC 3 (programmable metallization cell) in FIG. 2 represents the solution-processed amorphous metal chalcogenide or solid electrolyte (SE).
(d) The surface is planarized (e.g., by CMP or chemical mechanical polishing) of the material, stopping on the dielectric.
(e) The top electrode 4 is deposited and patterned—either using a regular (conventional litho+metal pattern) process or a damascene process (which refers to an inverse process involving creating patterns in the ILD, then filling them up with metal and then polishing the metal). The top electrode 4 could be Ag/Cu/W/Al or any other metal with any appropriate barrier layers. In addition, the entire stack could be flipped FIG. 3 illustrates a mushroom cell. This structure can be fabricated using many sequences, one of which is illustrated below:

(a) Bottom electrode 1 patterning and planarization (with ILD 2, represented by the grey region).
(b) Spin-on of the solid electrolyte material 3 (either co-doped with Ag/Cu during spin coating or UV doped to saturation after deposition). Note that the solid electrolyte 3 (denoted SE or PMC) need not be patterned in this case.
(c) Top electrode 4 deposition and patterning—either using a regular or a damascene process.

Figure 4:
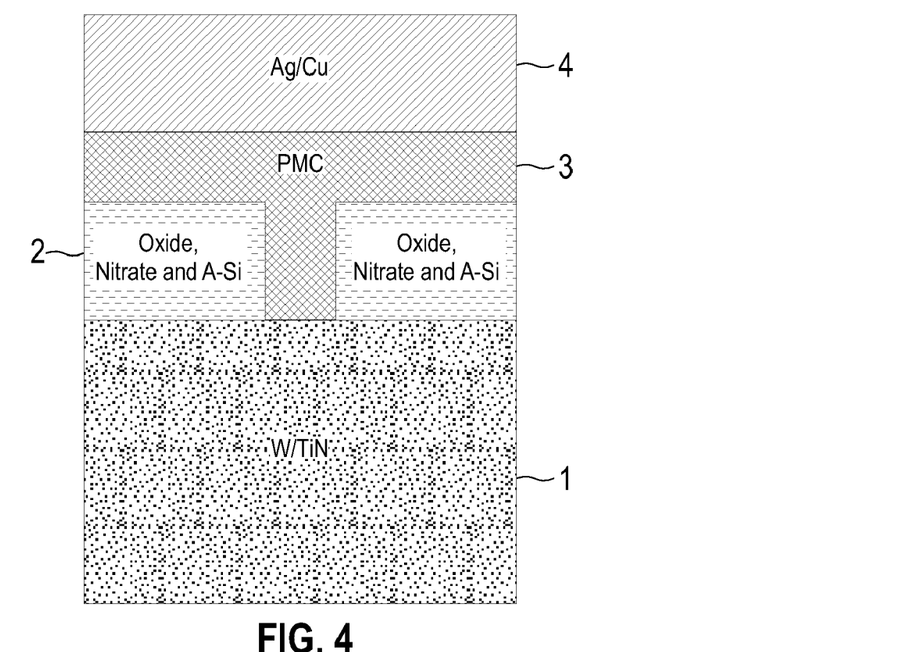
FIG. 4 is a schematic diagram of a pore cell employing the solid electrolyte of this disclosure.

FIG. 4 illustrates a pore cell. This is very similar to the pillar cell (FIG. 2) except that, although the PMC is planarized, the planarization is not stopped on the oxide but rather earlier. Note the need to fill a via or trench in this structure (as for FIG. 2) during the deposition of the SE (or PMC).

Figure 5:
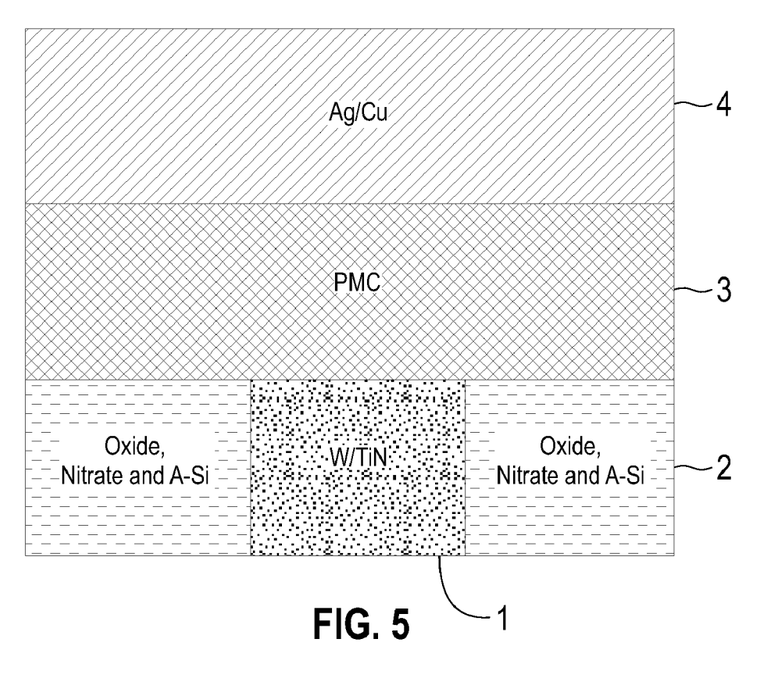
FIG. 5 is a schematic diagram of a further device employing the solid electrolyte of this disclosure.

FIG. 5 illustrates a further embodiment. In this embodiment, the solid electrolyte material 3 is planar and is deposited between 2 layers of metals 1 and 4 (one above and one below that are patterned). The bottom layer consists of the ILD 2 (could be oxide, nitride or low-K material; represented in grey), with imbedded metal 1 (could be W, Cu, TiN, for example; represented in black). The solid electrolyte 3 may or may not be patterned. Ideally, the solid electrolyte 3 is a continuous layer. But patterning may help reduce interference between adjacent cells.

In order to increase the density of memory technologies (both volatile and nonvolatile), a crosspoint design is one desirable option. In such an optimized design, the wordline and bitlines (henceforth referred to as memory lines) run at minimum pitch and in perpendicular directions. A storage element is placed at the sandwich of these perpendicularly oriented lines. Two possible designs exist:

(a) A nano-crossbar design, where the memory lines run at sublithographic pitches. This decreases memory cell area from 4 $F^2$ to $4Fs^2$ where 2Fs is the nanoscale pitch. Typically Fs<<F where F is the lithographic pitch. Disclosures that refer to how to interface these sublithographic features to lithographically defined wordline and bitline driver/decoder circuits can be found in U.S. patent application Ser. No. 11/679,785 filed Feb. 18, 2007 to Soundararajan and assigned to International Business Machines Corporation, the assignee of this application. The entire disclosure of which is incorporated herein by reference.
(b) A 3D design, where the memory lines run at lithographic pitches, but having multiple layers of these memories. The effective cell size decreases as 4 $F^2$/n, where n is the number of 3D layers (n≧1).

In both cases, at the intersection of the memory lines, two device components are needed, a memory element and a diode. The solution-processed solid electrolyte materials described herein may apply to both of these components—i.e., in certain embodiments, it may be used as a memory element and in certain other embodiments, it may be used as a diode:

(a) A memory element that is used to store data/information. Many options exist here (including Phase-Change Memory, MRAM, Solid Electrolyte Memory and FeRAM for example). In the case of the current disclosure, the use of solid electrolyte materials based on solution-processed amorphous metal chalcogenides is being referenced.
(b) Since a transistor does not exist at every cross-point, also needed is a device that can rectify (exhibit nonlinearity). This ensures that cells that lie on unselected wordlines and bitlines are not inadvertently programmed or shorted to each other.

While several representative examples of improved electrolytic device structures that employ the solution-processed amorphous metal chalcogenides as the active layer have been exemplified, many others can be envisioned by those skilled in the art and are also included within the scope of this disclosure.

The following non-limiting examples are presented to further illustrate the present disclosure.

Amorphous germanium (IV) sulfide, $GeS_{2-x}$, is one of the prime candidates for use in electrolytic cells, because of the ease with which it forms a glass and the stability of the resulting glass with respect to crystallization. In addition, metals (e.g., Ag, Cu, Li) can readily be diffused into films of this material. As a first demonstration of the disclosure, films of $GeS_{2-x}$ are deposited from solution and characterized. In this case, the metal chalcogenide films will be deposited using spin coating, although they could also be deposited using other solution-based techniques such as stamping, printing, dip coating or doctor blading. Note that the formula for germanium(IV) sulfide is written here as $GeS_{2-x}$, to reflect the fact that there is some range of sulfur stoichiometry that can be accommodated by this system.

Figure 6:
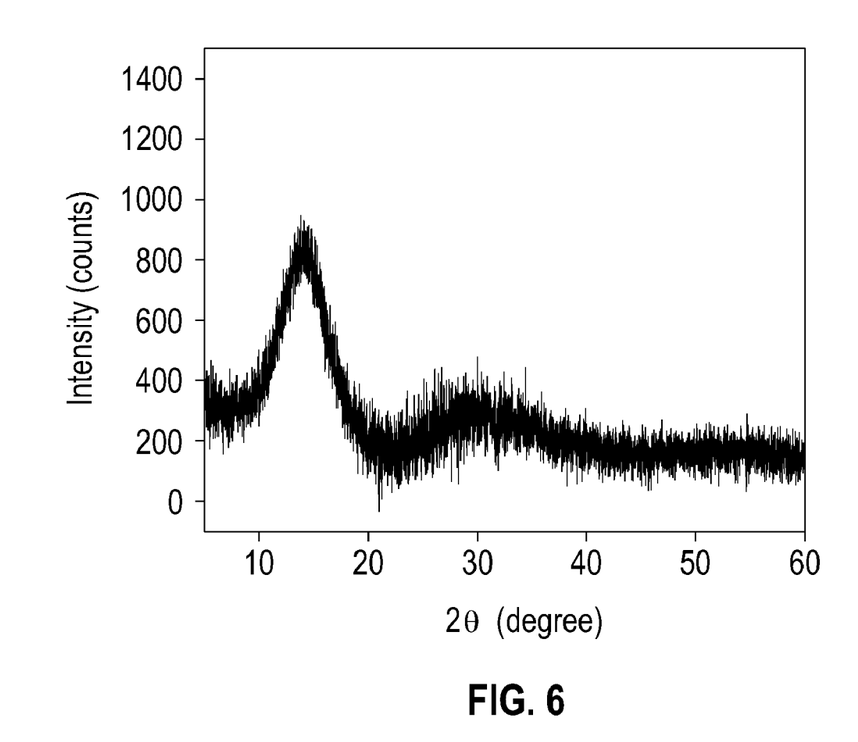
FIG. 6 represents the powder X-ray diffraction pattern of a $GeS_x$ deposit, prepared according to the method of this disclosure.

A solution of $GeS_2$ is created by dissolving 0.164 g of $GeS_2$ (1.2 mmol) in 4.8 mL of as-received anhydrous hydrazine (98%). The reaction and resulting solution is maintained in an inert atmosphere (e.g., nitrogen or argon). The dissolution is relatively quick at room temperature, requiring <0.5 hr with stirring to produce a clear essentially colorless solution. The solution is filtered through a 0.2 μm syringe filter, while being dispensed onto a substrate for the spin coating process. Some of the solution is also evaporated on a glass slide and decomposed under nitrogen at 350° C. for ~½ hr, yielding an amorphous material, as indicated by X-ray diffraction (FIG. 6). This demonstrates the nominally amorphous nature of $GeS_x$ materials prepared from the hydrazine-based precursors, at least for annealing temperatures up to 350° C.

FIG. 6 represents the powder X-ray diffraction pattern of a $GeS_x$ deposit, formed by evaporating the germanium sulfide precursor solution on a glass slide and then decomposing the precursor at a temperature of 350° C. on a hot plate (in an inert atmosphere). The amorphous nature of the deposit is indicated by the lack of sharp X-ray peaks in the diffraction pattern.

EXAMPLE 1

$GeS_2$ on Si/SiO$_2$

A film of the $GeS_2$ precursor is readily deposited on a clean thermally-oxidized silicon substrate using a spin-coating technique and the solution described above. Each substrate is pre-cleaned by first using a soap scrub, followed by sequential sonication in ethanol and dichloromethane, and finally using a Piranha clean (hydrogen peroxide: sulfuric acid) with a deionized (DI) water rinse. Thin films of the $GeS_2$ precursor are formed by depositing 2-3 drops of the above-mentioned $GeS_2$ solution onto the substrate, allowing the solution to spread on the substrate for about 10 sec and spinning the substrate at 2000 rpm for about 2 min in a nitrogen-filled drybox.

The resulting precursor films are dried on a hot plate at 100° C. for about 5 minutes in an inert atmosphere, followed by a decomposition heat treatment at 250° C. for about 10 minutes on the same hot plate (gradual heating to this temperature over ½ hr). The latter decomposition heat treatment yields thin films of amorphous $GeS_2$. Thickness of the film can be controlled by choice of solution concentration and spin speed during deposition. Additional control over solution properties and film stoichiometry can be provided by adding extra S to the spin coating solution. Using the conditions described above, film thicknesses and compositions are achieved (determined using Rutherford Backscattering Spectroscopy —RBS) as follows:

| Film | [Ge] at. % | [S] at. % | thickness (Å) |
|------|-----------|-----------|---------------|
| A | 42.7 ± 0.5 | 57.3 ± 0.5 | 261 ± 20 |
| B | 34.7 ± 0.5 | 65.3 ± 0.5 | 349 ± 20 |
| C | 34.2 ± 0.5 | 65.8 ± 0.5 | 389 ± 20 |
| D | 33.7 ± 0.5 | 66.3 ± 0.5 | 400 ± 20 |

Figure 7:
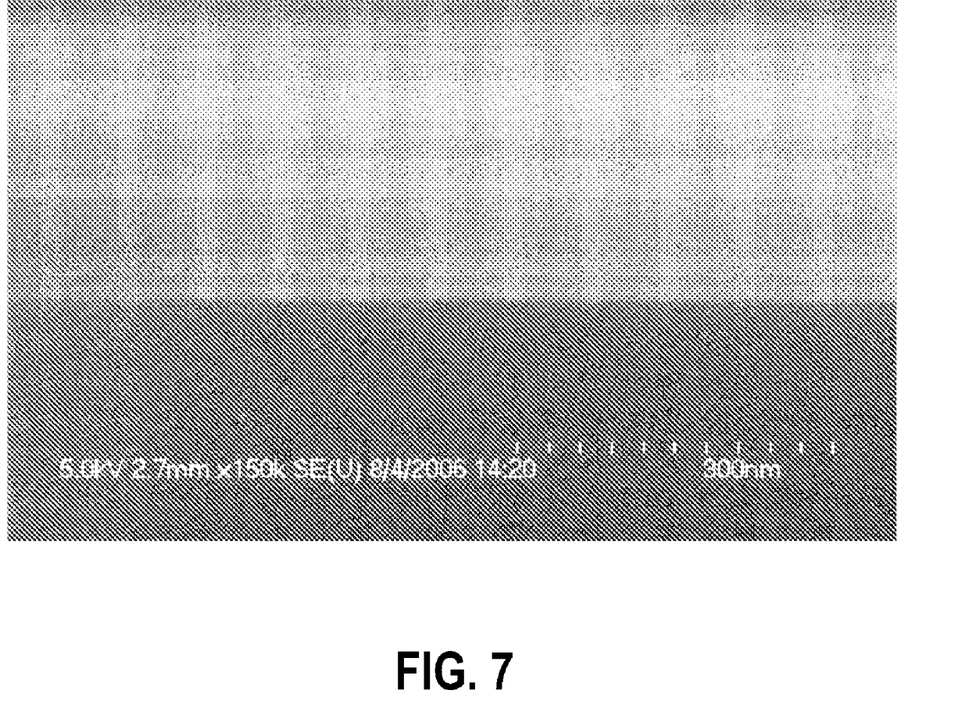
FIG. 7 is a cross-sectional SEM of a $GeS_{2-x}$ film (grey material) prepared on $SiO_2$ (white material).

Several representative cross sectional SEM (scanning electron microscope) images of the resulting films are given below:

FIG. 7 is a cross-sectional SEM of a $GeS_{2-x}$ film (grey material) prepared on SiO$_2$ (white material). The bottom surface is Si.

Figure 8:
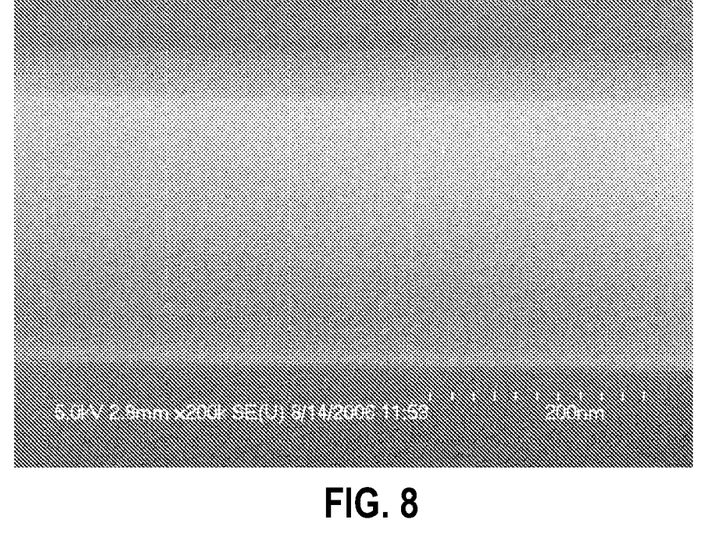
FIG. 8 is a cross-sectional SEM of a $GeS_{2-x}$ film prepared on $SiO_2$.

FIG. 8 is a cross-sectional SEM of a $GeS_{2-x}$ film (grey material) prepared on SiO$_2$ (white material). The bottom surface is Si.

Figure 9:
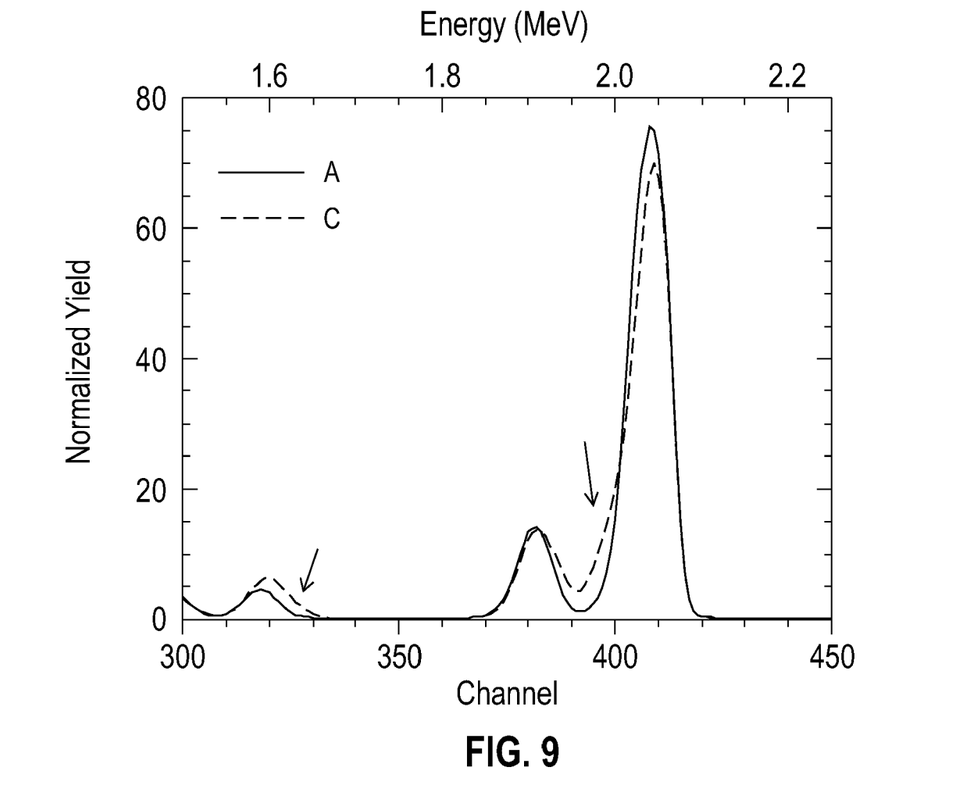
FIG. 9 shows RBS spectra for two films that are coated with 20 nm of Ag (no UV treatment).

Ag is deposited (~20 nm) on top of two representative films (Film A and C). RBS of the resulting composite films yields the following RBS spectra:

FIG. 9 shows a RBS spectra for two films (A and C) that are coated with 20 nm of Ag. The large peak centered around 2.05 MeV corresponds to Ag; the peak centered at ~1.9 MeV corresponds to Ge; the peak centered at ~1.6 MeV corresponds to S.

Note that the Ag-coated film C which was nominally stoichiometric GeS$_2$ before Ag deposition, exhibits more asymmetrical RBS peaks, indicative of interaction between the Ag overlayer and the GeS$_2$-x underfilm. The arrows (FIG. 9) indicate the interaction and it seems more pronounced for Ag and S peaks than for the Ge peaks. This may indicate that the S is reacting only with the Ag cations and that the Ge is more of a "spectator". This would be consistent with the fact that only film C, with higher [S], is interacting substantially with the Ag overlayer.

Figure 10A:
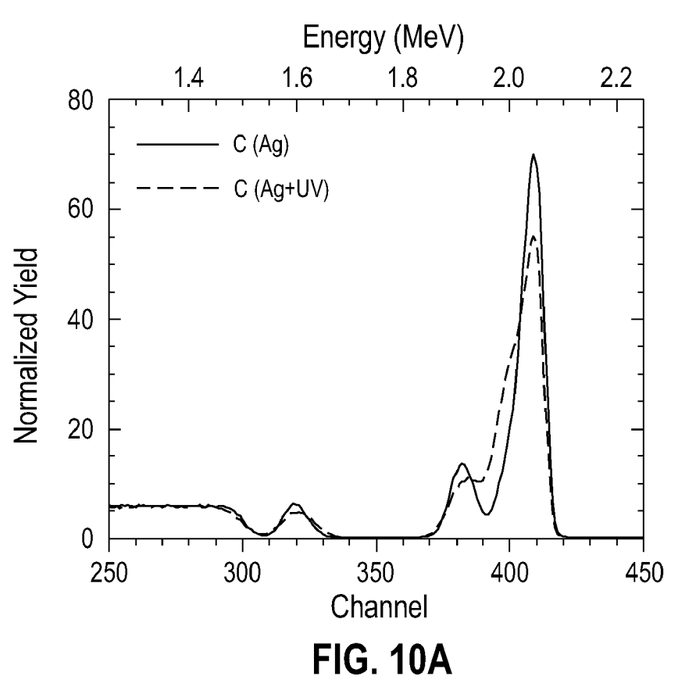
FIGS. 10A and 10B, shows RBS spectra for two films that have been coated with Ag (with UV treatment).
Figure 10B:
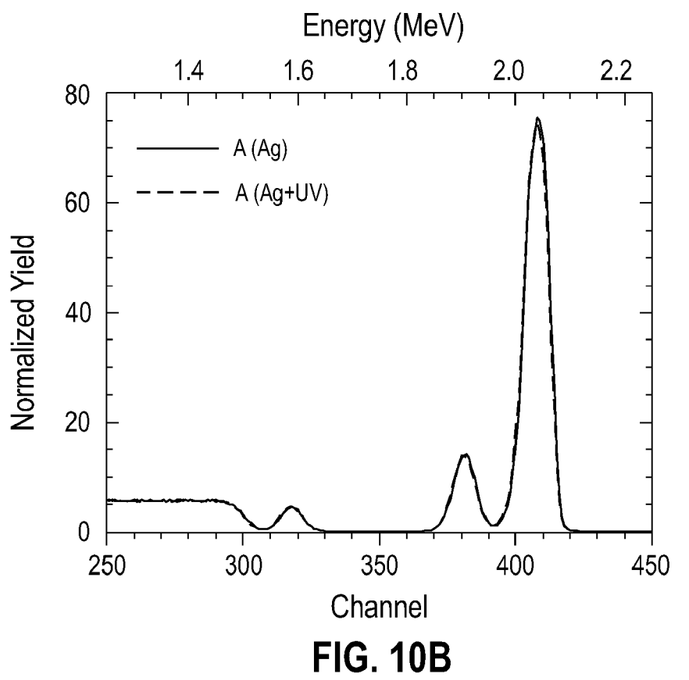

After RBS analysis, the two films are then subjected to a UV exposure. The exposure consists of 7 mW/cm$^2$ treatment (measured with a 253.7 nm detector head on an OAI power meter) in a nitrogen environment for three consecutive 15 minute intervals. The total exposure, therefore, is 18,900 mJ/cm$^2$. As evident in FIG. 10, film C substantially interacts with the Ag during the UV treatment, whereas film A does not change substantially as a result of exposure. For film C, UV-treatment resulted in about 30 at. % Ag uniformly spread throughout the $GeS_{2-x}$ film. These data suggest that the exact film stoichiometry can substantially impact the ability of Ag to diffuse in the solution processed amorphous $GeS_{2-x}$ films. Given that metal diffusion is critical for the operation of electrolytic devices, control over film stoichiometry (as described above) may be important for the formation of operational and optimized devices.

FIG. 10 shows RBS spectra for two films that have been coated with 20 nm of Ag. The black curves correspond to films that have just had the Ag deposition (same as in FIG. 9), while the gray curves have been UV-treated.

The doped and undoped GeS$_2$ films described in Example 1 could be used in any of the device geometries described above.

EXAMPLE 2

GeS$_2$ on Ag-Coated Si/SiO$_2$ w/Device Results

A solution of GeS$_2$ is created by dissolving 0.055 g of GeS$_2$ (0.4 mmol) in 1.6 mL of anhydrous hydrazine (same concentration as in Example 1). The solution is stored about 4 weeks before use for this example. The reaction and resulting solution are maintained in an inert atmosphere (e.g., nitrogen or argon). The solution is filtered through a 0.2 μm syringe filter, while being dispensed onto a substrate for the spin coating process.

A film of the GeS$_2$ precursor is readily deposited onto an Ag-coated (about 200 nm; deposited by e-beam evaporation) p+ silicon substrate using a spin-coating technique and the solution described above. Each Ag-coated substrate is cleaned in an ammonium hydroxide/water mixture for approximately 10 min, rinsed with DI water and blown dry with compressed air before spin coating. Thin films of GeS$_2$ precursor are formed by depositing 2-3 drops of the above-mentioned GeS$_2$ solution onto the substrate, allowing the solution to spread on the substrate for about 10 seconds and spinning the substrate at 2000 rpm for 2 min in a nitrogen-filled drybox.

The resulting precursor films are dried on a hot plate at 120° C. for 5 minutes in an inert atmosphere, followed by a decomposition heat treatment at 260° C. for 10 minutes on the same hot plate (preheated hotplate rather than gradual heating). The latter decomposition heat treatment yields thin films of amorphous $GeS_2$ w/the Ag undercoat (see cross sectional SEM in FIG. 11). Thickness of the film can be controlled by choice of solution concentration and spin speed during deposition. Using the conditions described above, a film thickness of about 36 nm and a [S]/[Ge] ratio of ~1.75 (i.e., slightly S deficient relative to ideal $GeS_2$) is achieved, as determined by RBS. However, as for the UV-treated $GeS_2$ film described in Example 1, there is a substantial concentration (>30 at. %) of Ag (more accurate Ag content is difficult to derive from RBS data due to the thick Ag layer underneath the relatively thin metal chalcogenide layer) in the amorphous chalcogenide film. Since these films have not been subjected to a UV diffusion treatment, this means that the Ag diffusion is accomplished in-situ during the decomposition heat treatment used to form the amorphous chalcogenide film from the precursor film (i.e., heating to 260° C. for 10 min). The Ag-diffused $GeS_2$-x film is suitable for use in a variety of electrolytic device structures as shown above.

Figure 11:
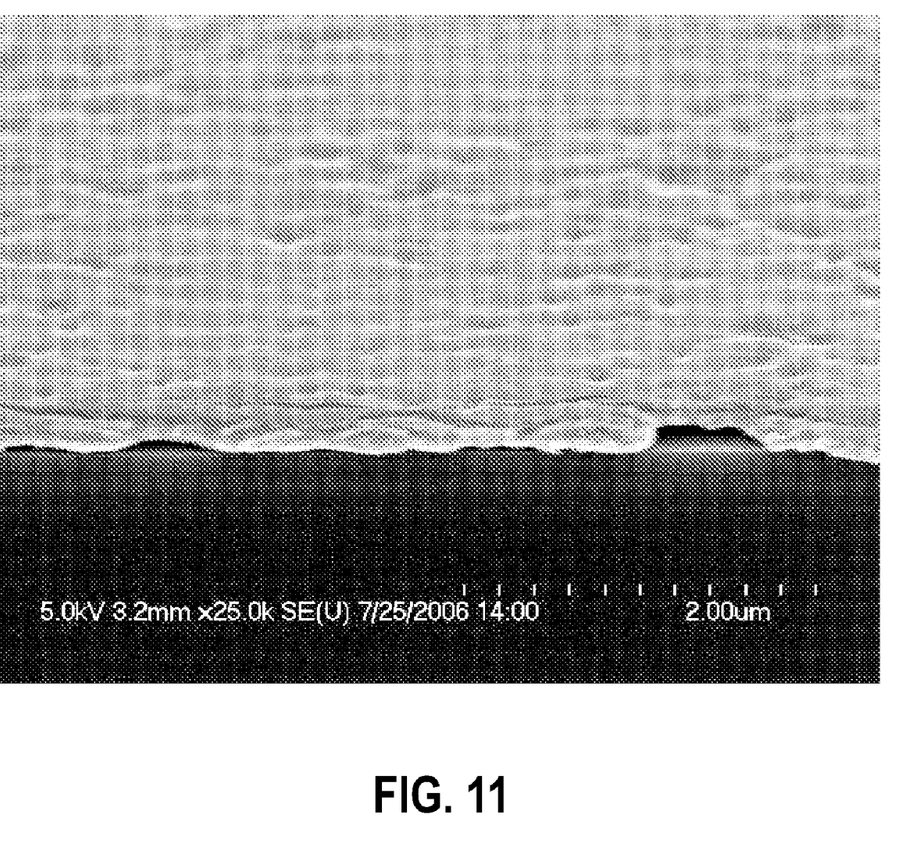
FIG. 11 is a cross sectional SEM image of a spin-coated $GeS_{2-x}$ film on Ag.

FIG. 11 is a cross sectional SEM image of a spin-coated $GeS_{2-x}$ film on Ag.

To make a simple test structure, the resulting $Ag_yGe_xS_z$ film on Ag is probed using a W tip (tip area about 10×10 microns; acts as the cathode), effectively resulting in an inverted mushroom-type structure (see FIG. 3 above; in this case Ag is on the bottom and W on the top). Contact to the Ag anode is made through the adjacent p+ silicon substrate. By probing carefully (so as not to punch through the metal chalcogenide film with the W tip), functional devices are prepared that exhibited typical solid-electrolye device behavior (compare FIGS. 12A and B with FIG. 1). While the endurance of the device is poor with respect to cycling, most likely due to operation in air and a relatively rough surface, these results clearly demonstrate the feasibility of employing a spin-coated amorphous metal chalcogenide film as the active layer in an electrolytic device.

Figure 12A:
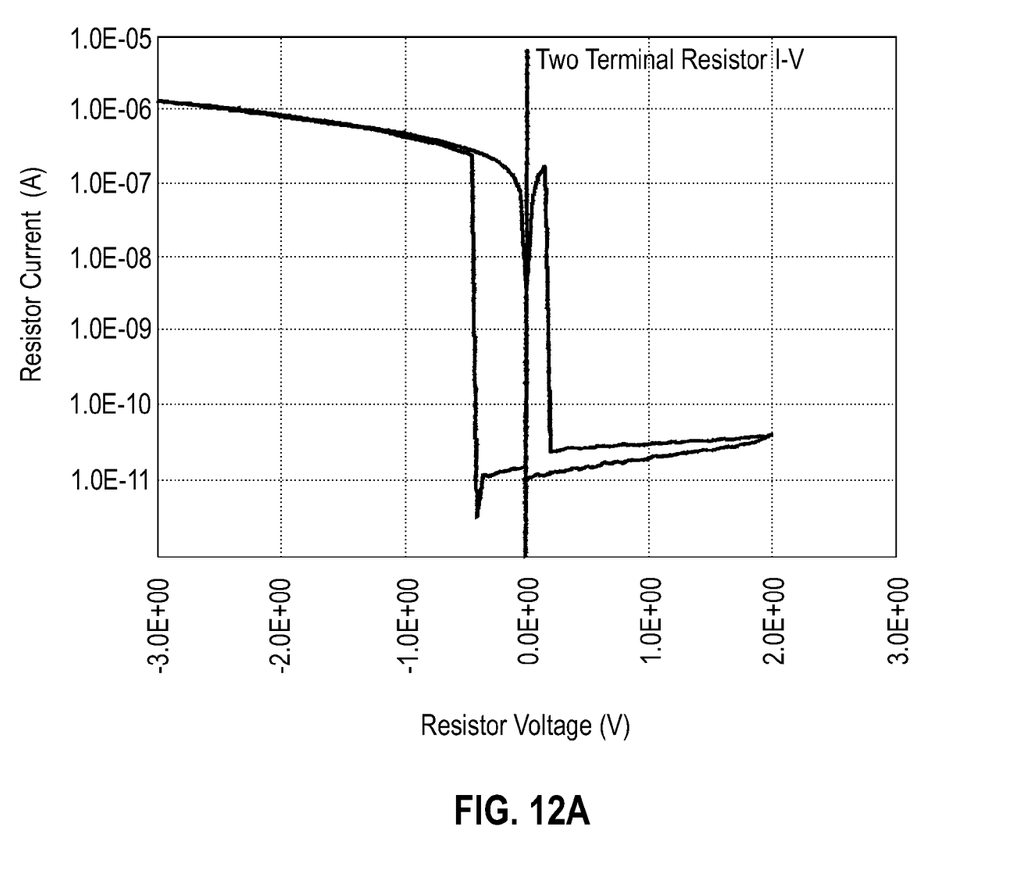
Figure 12B:
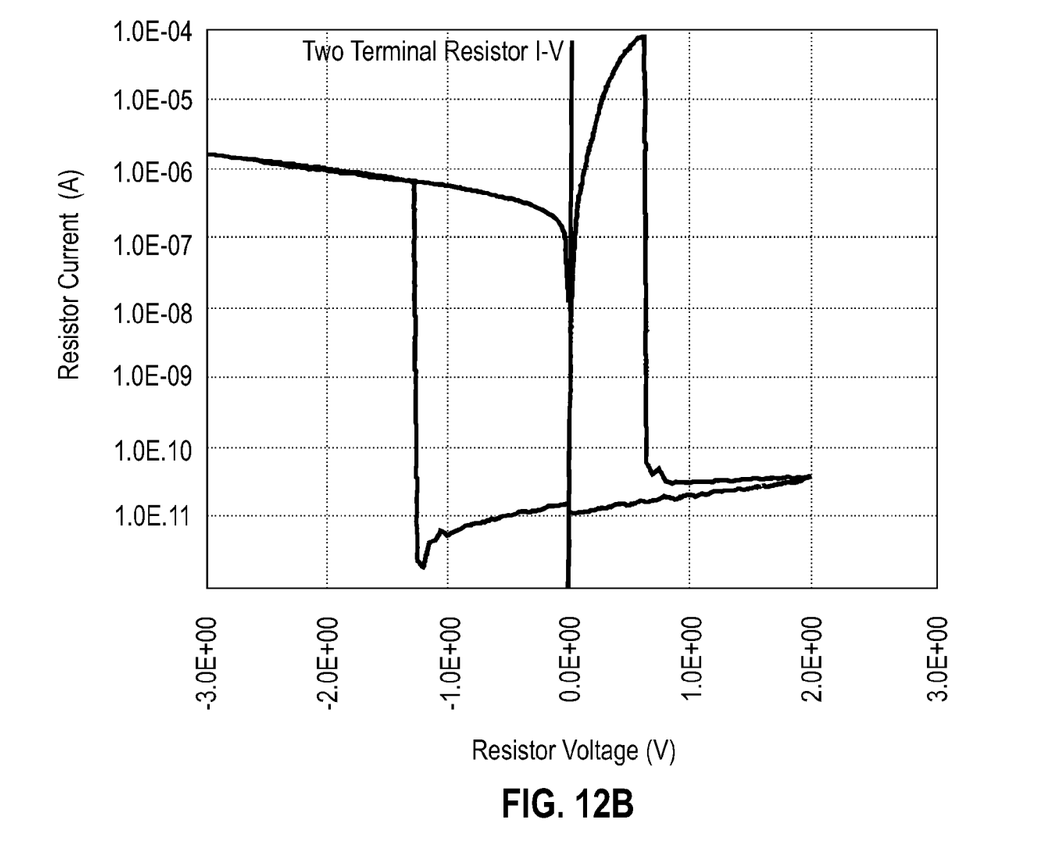

FIGS. 12 A and B show device characteristics for two electrolytic memory cells (inverted mushroom-type), with Ag (anode) on bottom, spin coated $Ag_xGe_yS_z$ in the middle (solid electrolyte) and a W tip (cathode) on the top.

EXAMPLE 3

$GeS_2$ Doped with Cu on $Si/SiO_2$

A solution of $GeS_2$ is created by dissolving 0.055 g of $GeS_2$ (0.4 mmol) in 1.6 mL of the same anhydrous hydrazine as used in Example 2. The solution is stored 24 hr before use. A solution of $Cu_2S$ is prepared by stirring 0.159 g of $Cu_2S$ (1 mmol) and 0.064 g of S (2 mmol) in 5 mL of anhydrous hydrazine for a period of approximately two weeks. The resulting yellow solution still had a small quantity of black specks, which were removed by filtration through a 0.2 µm syringe filter during dispensing of the solution. The composite solution for spin coating was prepared by stirring (for two minutes) 0.4 mL of the $GeS_2$ solution (containing 0.1 mmol $GeS_2$) with 0.25 mL of the filtered $Cu_2S$ solution (containing 0.05 mmol $Cu_2S$). All processing is performed in a nitrogen-filled glove box with oxygen and water levels below 1 ppm.

Each substrate for spin coating was pre-cleaned by first using a soap scrub, followed by sequential sonication in ethanol and dichloromethane, and finally using a Piranha clean (hydrogen peroxide: sulfuric acid) with a DI water rinse. Thin films of Ge—Cu—S precursor are formed by depositing 2-3 drops of the above-mentioned composite solution onto the substrate, allowing the solution to spread on the substrate for ~10 sec and spinning the substrate at 2000 rpm for 2 min in a nitrogen-filled drybox.

The resulting precursor films are dried on a hot plate at 100° C. for 5 minutes in an inert atmosphere, followed by a decomposition heat treatment at 300° C. for 20 min on the same hot plate (preheated hot plate). The latter decomposition heat treatment yields metal chalcogenide thin films. Thickness of the film can be controlled by choice of solution concentration and spin speed during deposition. Using the conditions described above, film composition and thickness are achieved (determined using Rutherford Backscattering Spectroscopy-RBS) of 19.1 at. % Ge, 28.8 at. % Cu, 52.1 at. % S and 24(1) nm thickness. Substantial Cu is therefore successfully incorporated with the Ge—S in the resulting films, demonstrating that the doping process can be achieved during spin coating by incorporation of the dopant metal in the solution (no need for UV treatment).

The term "comprising" (and its grammatical variations) as used herein is used in the inclusive sense of "having" or "including" and not in the exclusive sense of "consisting only of." The terms "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

All publications, patents and patent applications cited in this specification are herein incorporated by reference, and for any and all purposes, as if each individual publication, patent or patent application were specifically and individually indicates to be incorporated by reference. In this case of inconsistencies, the present disclosure will prevail.

What is claimed is:

1. A solid electrolyte device comprising:
an amorphous chalcogenide solid active electrolytic layer;
a first metallic layer;
a second metallic layer and
wherein the amorphous chalcogenide solid active electrolytic layer is located between the first and second metallic layers and wherein the amorphous chalcogenide solid active electrolytic layer is prepared by obtaining a solution of a precursor to a metal chalcogenide or a precursor to a metalloid chalcogenide;
applying the solution onto a substrate; and
thereafter annealing the precursor to convert the precursor to the metal chalcogenide or metalloid chalcogenide, and
further comprising an inter-level dielectric with imbedded metal wires located beneath the amorphous chalcogenide solid electrolytic layer and wherein the said imbedded metal wires comprise the first metallic layer.

2. The solid electrolyte device of claim 1 wherein said solution is prepared by directly dissolving a metal chalcogenide in a hydrazine compound and optionally an excess of chalcogen.

3. The solid electrolyte device of claim 1 wherein said solution is prepared by contacting an isolated hydrazine-based precursor of a metal chalcogenide and a solvent to form a solution thereof.

4. The solid electrolyte device of claim 1 wherein said solution is prepared by directly dissolving the corresponding metal of the metal chalcogenide in a hydrazine compound, with at least enough chalcogen added to affect the formation and dissolution of the metal chalcogenide in solution.

5. The solid electrolyte device of claim 1 wherein said solution is prepared by dissolving a preformed hydrazinium-based precursor in a non-hydrazine-based solvent.

6. The solid electrolyte device of claim 1 wherein said solution is prepared by contacting a metal chalcogenide and a salt of an amine to produce an ammonium-based precursor of the metal chalcogenide, which is then contacted with a hydrazine compound and optionally, an elemental chalcogen.

7. The solid electrolyte device of claim 1 wherein said solution is applied by a process selected from the group consisting of spin coating dip coating, doctor blading, drop casting stamping and printing.

8. The device of claim 1 wherein the annealing is carried out at a temperature of about 50° C. to about 400° C.

9. The solid electrolyte device of claim 1 wherein the annealing is carried out at a temperature of about 100° C. to about 350° C.

10. The solid electrolyte device of claim 1 wherein the annealing is carried out for about 0.2 hours to about 6 hours.

11. The solid electrolyte device of claim 1 wherein the annealing is carried out employing a hotplate, in oven/furnace, laser annealing or microwave.

12. The solid electrolyte device according to claim 1 being a pillar cell which further comprises an inter-level dielectric having a via located between the first and second metallic layers and the amorphous chalcogenide solid active electrolytic layer is located in the via in the inter-level dielectric.

13. The solid electrolyte device according to claim 1 being a mushroom cell which further comprises an inter-level dielectric having a via filled with a metallic conductor located between the first and second metallic layers and wherein the amorphous chalcogenide solid active electrolytic layer is located on top of the inter-level dielectric.

14. The solid electrolyte device according to claim 1 being a pore cell which further comprises an inter-level dielectric having a via located between the first and second metallic layers and wherein the amorphous chalcogenide solid active electrolytic layer is located in the via and on top of the inter-level dielectric.

15. The solid electrolyte device according to claim 1 wherein the amorphous chalcogenide solid active electrolytic layer comprises a dopant.

16. The solid electrolyte device according to claim 15 wherein the dopant is at least one member selected from the group consisting of Ag, Cu, Zn, and Li.

17. The solid electrolyte device according to claim 1 wherein the metal or metalloid moiety of the chalcogenide is selected from the group consisting of tin, germanium, lead, indium, antimony, mercury, gallium, thallium, potassium, copper, iron, cobalt, nickel, manganese, tungsten, molybdenum, zirconium, hafnium, titanium, and niobium and combinations thereof and the chalcogen is selected from the group consisting of S, Se, Te and combinations thereof.

* * * * *

UNITED STATES PATENT AND TRADEMARK OFFICE
CERTIFICATE OF CORRECTION

| | | |
|---|---|---|
| PATENT NO. | : 7,928,419 B2 | Page 1 of 1 |
| APPLICATION NO. | : 11/830213 | |
| DATED | : April 19, 2011 | |
| INVENTOR(S) | : Kailash Gopalakrishnan et al. | |

It is certified that error appears in the above-identified patent and that said Letters Patent is hereby corrected as shown below:

At Col. 8, line 18, "Feb. 18, 2007 to Soundararajan" should read --Feb. 27, 2007 to Gopalakrishnan--

Signed and Sealed this
Seventh Day of June, 2011

David J. Kappos
*Director of the United States Patent and Trademark Office*